(12) United States Patent
Ciacci et al.

(10) Patent No.: US 9,172,329 B2
(45) Date of Patent: Oct. 27, 2015

(54) HARMONIC SUPPRESSION IN SWITCHING AMPLIFIERS

(75) Inventors: Massimo Ciacci, Den Bosch (NL); Jos Verlinden, Wachtendonk (DE); Remco van de Beek, Eindhoven (NL)

(73) Assignee: NXP B.V., Eindhoven (NL)

( * ) Notice: Subject to any disclaimer, the term of this patent is extended or adjusted under 35 U.S.C. 154(b) by 534 days.

(21) Appl. No.: 13/564,013

(22) Filed: Aug. 1, 2012

(65) Prior Publication Data

US 2014/0038534 A1 Feb. 6, 2014

(51) Int. Cl.

| H03F 3/217 | (2006.01) |
|---|---|
| H03F 1/32 | (2006.01) |
| H03C 5/00 | (2006.01) |
| H03F 3/24 | (2006.01) |
| H04L 25/02 | (2006.01) |

(52) U.S. Cl.
CPC ............... *H03C 5/00* (2013.01); *H03F 3/2173* (2013.01); *H03F 3/24* (2013.01); *H04L 25/0272* (2013.01)

(58) Field of Classification Search
CPC .......................................... H03F 3/217–3/2178
USPC ................................ 455/102, 108, 110, 114.1
See application file for complete search history.

(56) References Cited

U.S. PATENT DOCUMENTS

| 5,115,203 A * | 5/1992 | Krett et al. ..................... 330/251 |
|---|---|---|
| 7,519,348 B2 | 4/2009 | Shah | |
| 2008/0037662 A1* | 2/2008 | Ravi et al. ..................... 375/260 |
| 2009/0191826 A1* | 7/2009 | Takinami et al. ............. 455/110 |
| 2009/0243744 A1 | 10/2009 | Beale et al. | |
| 2013/0142283 A1* | 6/2013 | Hori .............................. 375/300 |

FOREIGN PATENT DOCUMENTS

| WO | 2005091493 A1 | 9/2005 |
|---|---|---|
| WO | 2007069193 A2 | 6/2007 |
| WO | 2010105031 A2 | 9/2010 |
| WO | WO2012017580 A1 * | 2/2012 |

OTHER PUBLICATIONS

Sai Chun Tang and Gregory T. Clement, A Harmonic Cancellation Technique for an Ultrasound Transducer Excited by a Switched-Mode Power Converter, Feb. 2008, ieee transactions on ultrasonics, ferroelectrics, and frequency control, vol. 55, No. 2, pp. 359-367.*

(Continued)

*Primary Examiner* — Gennadiy Tsvey (57) ABSTRACT

Configurable suppression of harmonics in a radio frequency (RF) transmitter circuit having two class-D switching amplifiers that produce a differential output signal having introduced harmonics is contemplated. A selected harmonic is used to determine a time duration. A harmonic suppression circuit modifies a radio frequency polar modulated data signal that is encoded using an amplitude component and a phase component. The modification is responsive to the determined time duration. The switching power amplifiers amplify the modified polar modulated data signal to produce an amplified signal. The amplified signal includes three signal levels, a high signal level, a middle signal level and a low signal level. The timing of transitions between the high and low signal levels represents the phase component, and the transitions include the middle signal level for the time duration, thereby suppressing the selected harmonic.

18 Claims, 8 Drawing Sheets

(56) References Cited

OTHER PUBLICATIONS

John G. Kassakian, Principles of Power Electronics, 1991, Addison-Wesley Publishing Company, Inc., pp. 173-179.*

Weldon et al., "A 1.75-GHz Highly Integrated Narrow-Band CMOS Transmitter With Harmonic-Rejection Mixers," IEEE Journal of Solid-State Circuits, vol. 36, No. 12, Dec. 2001.
Extended European Search Report for Patent Appln. No. 13174363.5 (Dec. 9, 2013).

* cited by examiner

HARMONIC SUPPRESSION IN SWITCHING AMPLIFIERS

Aspects of the present disclosure relate to apparatuses, devices, and methods involving transmitter circuits for use with polar modulation techniques.

Communication circuits can be constructed using a variety of different modulation techniques. These modulation techniques have corresponding advantages and disadvantages. A particular modulation scheme is polar modulation.

Polar modulation makes use of polar coordinates, r (amplitude) and $\theta$ (phase). Accordingly, polar modulation can be accomplished using hybrid amplitude and phase signal pair, where amplitude is the envelope (therefore baseband BB) and the phase signal $\theta$ is a pure phase modulated carrier. Conversion to rectangular (x, y) coordinates can be obtained from polar coordinates using the equations: $x=r*\cos(\theta)$; $y=r*\sin(\theta)$. Conversely, polar coordinates can be obtained from rectangular coordinates using the equations: $r=\sqrt{x^2+y^2}$; $\theta=a \tan(y/x)$.

Polar modulation can therefore be accomplished by varying, over time, the magnitude of a carrier and/or the phase angle of the carrier. The varying magnitude and phase carry the information to be transmitted. Polar modulation transmitter can be designed for use at a particular frequency, which can correspond to the frequency of the carrier. Signal output at harmonic frequencies can cause problems, such as energy loss and interference with other communications.

A polar modulated signal can be amplified for transmission before it is provided to an antenna configured for wireless transmission. An amplifier circuit configured for such a purpose can be a significant source of power consumption in a transmitting device. A signal that is a perfect sine wave contains all of its energy at its fundamental frequency. A signal that is not a perfect sine wave, however, contains energy in harmonics around the fundamental frequency. Certain waveforms can contain large amounts of energy at harmonic frequencies. For instance, square waves, sawtooth waves, and triangular waves can each contain a non-negligible amount of energy in their harmonics. Consistent therewith, various embodiments of the present disclosure are directed toward amplifier circuits and associated methods.

Aspects of the present disclosure are directed to systems and methods useful for the suppression of harmonics in the context of a transmitter circuit that uses switching power amplifiers. These and other aspects of the present disclosure are exemplified in a number of illustrated implementations and applications, some of which are shown in the figures and characterized in the claims section that follows.

One or more embodiments relate to a method for providing configurable suppression of harmonics in a transmitter circuit that includes two class-D switching amplifiers that produce a differential output signal having introduced harmonics. As part of the method, a radio frequency polar modulated data signal is encoded using an amplitude component, and a phase component that is defined relative to a carrier is received by the radio frequency transmitter circuit. A harmonic suppression circuit is used to modify the polar modulated data signal using a time duration that is based upon a selected harmonic of the introduced harmonics. The switching power amplifiers are used to amplify the polar modulated data signal to produce an amplified signal of the polar modulated data signal. The amplified signal includes three signal levels, a high signal level, a middle signal level and a low signal level. The timing of transitions between high and low signal levels represents the phase component. The transitions are modified to include the middle signal level for the time duration for substantially suppressing the selected harmonic.

Consistent with certain embodiments, a device includes a transmitter circuit with two class-D switching amplifiers. The amplifiers are configured and arranged to produce a differential output signal having introduced harmonics in response to a radio frequency polar modulated data signal that is encoded using an amplitude component and a phase component. The phase component is defined, relative to a carrier, by timings of transitions between a high signal level and a low signal level. A harmonic suppression circuit is configured and arranged to modify the polar modulated data signal using a time duration. The time duration is based upon a selected harmonic of the introduced harmonics. The harmonic suppression circuit is also configured and arranged to provide the modified polar modulated data signal to the switching power amplifiers in a form that produces an amplified signal of the polar modulated data signal that includes a middle signal level that is between the high and low signal levels and thereby substantially suppresses the selected harmonic.

Consistent with embodiments of the present disclosure, a transmitter device suppresses harmonics introduced by a switching amplifier. The transmitter device includes a harmonic suppression circuit that is configured and arranged to introduce, to a polar modulated data signal that includes an amplitude component and a phase component that is defined by transitions between high and low signal levels, a third signal level. The third signal level has a voltage that is between a voltage of the high and low signal levels and that has a time duration that is based upon a selected harmonic of the introduced harmonics. A three-level switching amplifier is configured and arranged to amplify the polar modulated data signal with the introduced third signal level, thereby substantially suppressing the selected harmonic.

The above discussion is not intended to describe each embodiment or every implementation of the present disclosure. The figures, detailed description, and claims that follow more particularly exemplify various embodiments.

Aspects of the present disclosure may be more completely understood in consideration of the detailed description of various embodiments of the present disclosure that follows in connection with the accompanying drawings, in which.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

Aspects of the present disclosure are believed to be applicable to a variety of different types of devices, systems and arrangements, including those that may be implemented in transmitter circuit using polar modulation. While the present disclosure is not necessarily limited to such applications, various aspects of the invention may be appreciated through a discussion of various examples using this context.

Consistent with embodiments of the present disclosure, a transmitter circuit and device can be configured and arranged to amplify a polar modulated data signal. Although not necessarily limited thereto, the transmitter circuit can be particularly useful for providing high power efficiency and/or selective rejection of undesired harmonic frequencies. The transmitter circuit can also be designed with an amplifier circuit that facilitates robustness and/or cost savings in the device.

Aspects of the present disclosure are directed toward a method for providing targeted suppression of harmonics in a transmitter circuit. The transmission circuit can operate using a single three-level switching amplifier (for a single-end output) or two class-D switching amplifiers (for a differential output). Embodiments of the present disclosure are directed toward the recognition that (class-D) switching amplifiers can provide efficient amplification of an input signal. Aspects of the present disclosure also recognize that switching amplifiers provided with a sine wave will introduce harmonics. For instance, square waves are mathematically equivalent to the sum of a sine wave at that the fundamental frequency, plus an infinite series of odd-multiple frequency sine waves at diminishing amplitudes. Harmonics can cause a number of potential problems, not the least of which is interference with other transmission frequencies at or near the harmonic frequencies. Accordingly, even if provided with a perfect input that does not include undesirable frequency components, the use of a switching amplifier can introduce a number of problems.

Particular embodiments of the present disclosure are directed toward the modification of a radio frequency polar modulated data signal relative to introduced harmonics. The phase component of a polar modulated data signal can be defined, or otherwise recovered, through the timings of transitions between a high and low signal levels. This timing, relative to a carrier, carries data that can be recovered by a receiver. A harmonic suppression circuit can therefore be used to modify the polar modulated data signal to include a middle signal level that is between the high and low signal levels. This middle signal level can have a time duration that is based upon a selected harmonic of the introduced harmonics. In particular examples, the selected harmonic can be a harmonic that has been selected for suppression. The polar modulated data signal is then amplified using the switching power amplifiers to produce an amplified signal of the polar modulated data signal. The amplified signal can include the three different signal levels (high, middle and low) and thereby substantially suppress the selected harmonic.

Depending upon the particular application, suppression can lessen or remove the need for additional filter circuits for further suppressing harmonics of the amplified signal. The additional filter circuits might otherwise include an analog radio frequency (RF) filter, such as a bandpass, low pass, high pass and/or notch filter. Such filters might be included as part of an antenna matching circuit. In certain instances, such filter circuits can use components that are difficult or even impossible to manufacture on chip (e.g., using the same chip technology as the amplifier circuitry). Accordingly, a design for a transmitter device may otherwise call for external filtering components for the suppression of harmonics.

Certain embodiments of the present disclosure relate to a transmitter device for suppressing harmonics introduced by a single-ended switching amplifier. A harmonic suppression circuit is designed to introduce a third signal level to a polar modulated data signal. The polar modulated signal includes a phase component that is defined by a transition between high and low signal levels. The polar modulated signal also includes an amplitude component. The introduced third signal level has a voltage level that is between the high and low signal levels and a time duration that is based upon a selected harmonic of the introduced harmonics. The introduction occurs during the transition between high and low signal levels. A three-level switching amplifier configured and arranged to amplify the polar modulated data signal with the introduced third signal level, thereby substantially suppressing the selected harmonic.

Consistent with embodiments of the present disclosure, the polar modulated signal can be modulated to carry data using both an amplitude component and a phase component. Each of these components can be defined relative to a carrier sine wave. In a particular embodiment, a modulation circuit encodes the data by modulating the carrier sine wave in amplitude (r) and phase (θ). Using such polar modulation, the encoded data can be faithfully maintained while converting the modulated sine wave to a square wave. For instance, a square wave can carry the phase data (θ) according to the timing of transitions between high and low signal values of the square wave. The amplitude data (r) can also be maintained by way of adjusting, over time, the difference between the high and low signal values to correspond to the amplitude component. This adjustment can be accomplished by modifying the gain of the amplifier, adjusting the supply voltage of the amplifier or combinations thereof. As discussed herein, the conversion to a square wave introduces harmonics that can interfere with other radio frequency receivers. In particular, a square wave having a 50 percent duty cycle will contain odd harmonics of the fundamental frequency of the carrier wave.

Figure 1:
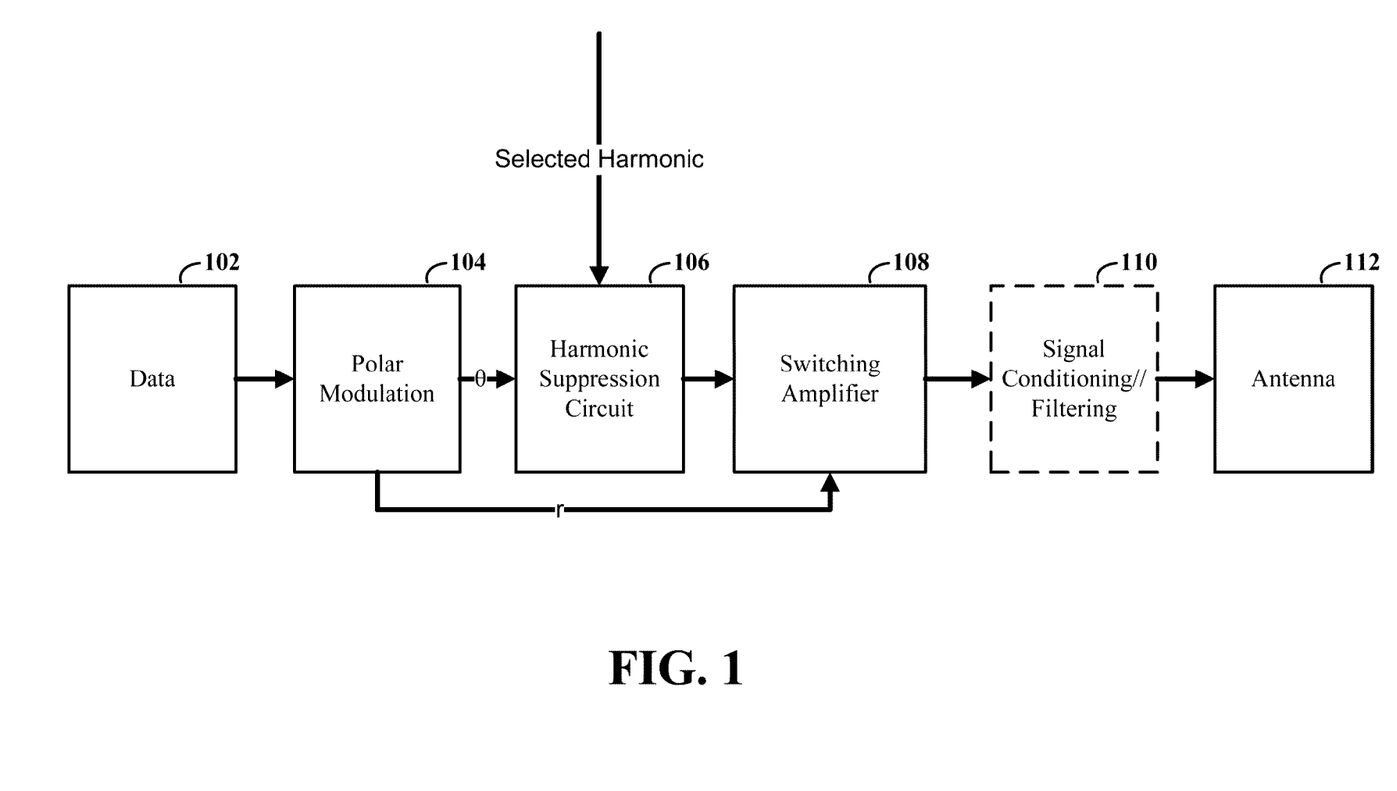
FIG. 1 depicts a flow diagram relating to a transmitter system using polar modulation, consistent with embodiments of the present disclosure.

Turning now to the figures, FIG. 1 depicts a flow diagram relating to a transmitter system using polar modulation, consistent with embodiments of the present disclosure. The system is designed to transmit data 102 using a polar modulation scheme 104. The polar modulation scheme 104 is carried out using a circuit that encodes the data using an amplitude component (r) and a phase component (θ). This encoding can be carried out by producing two different signals for the amplitude component and the phase component, respectively. The phase component is generated by upconversion of a baseband version of the data. This includes shifting the baseband signal to a frequency at, or near, the frequency of the carrier wave to produce a radio frequency (RF) signal $\theta_{RF}(t)$. The amplitude component is represented by the envelope of the signal at baseband (BB) or $r_{bb}(t)$.

Harmonic suppression circuit 106 is configured to modify the polar modulated data signal using a time duration that is based upon a selected harmonic. The selected harmonic can correspond to a harmonic that is created/introduced by way of the polar modulated data signal being represented by a square wave. For instance, the switching amplifier 108 can produce a square-wave output that includes/introduces odd harmonics (e.g., assuming a 50% duty cycle there are no even harmonics) to the polar modulated data signal. The selected harmonic can be one of these odd harmonics. For instance, the harmonic suppression circuit 106 can modify the polar modulated data signal such that the output of the switching amplifier 108 includes an intermediate voltage portion that exists for the time duration. The particulars of the modification can vary according to the operation and configuration of the switching amplifier 108. For instance, the switching amplifier 108 can provide either a differential or single-ended output and can receive either a differential or single-ended input signal. The particulars of the switching amplifier 108 can have a corresponding effect on how the harmonic suppression circuit 106 modifies the polar modulated data signal.

In certain embodiments, the harmonic suppression circuit 106 is configured to modify the polar modulated data signal in a manner that results in an intermediate voltage portion, which exists for the time duration, to be introduced to a voltage signal transition of the output of the switching amplifier 108. For instance, the switching amplifier 108 can produce a square wave that represents a phase component (and amplitude component) for the polar modulated data signal. The square wave transitions between high to low voltage based upon a carrier wave and upon the phase component. The harmonic suppression circuit 106 is configured to modify the polar modulated data signal such that the transitions include the intermediate voltage portion. The length of the intermediate voltage portion is set in response to a frequency of the selected harmonic.

In some embodiments, additional signal conditioning/filtering circuit 110 can be optionally provided before the amplified signal is provided to the antenna 112 for wireless transmission.

Figure 2:
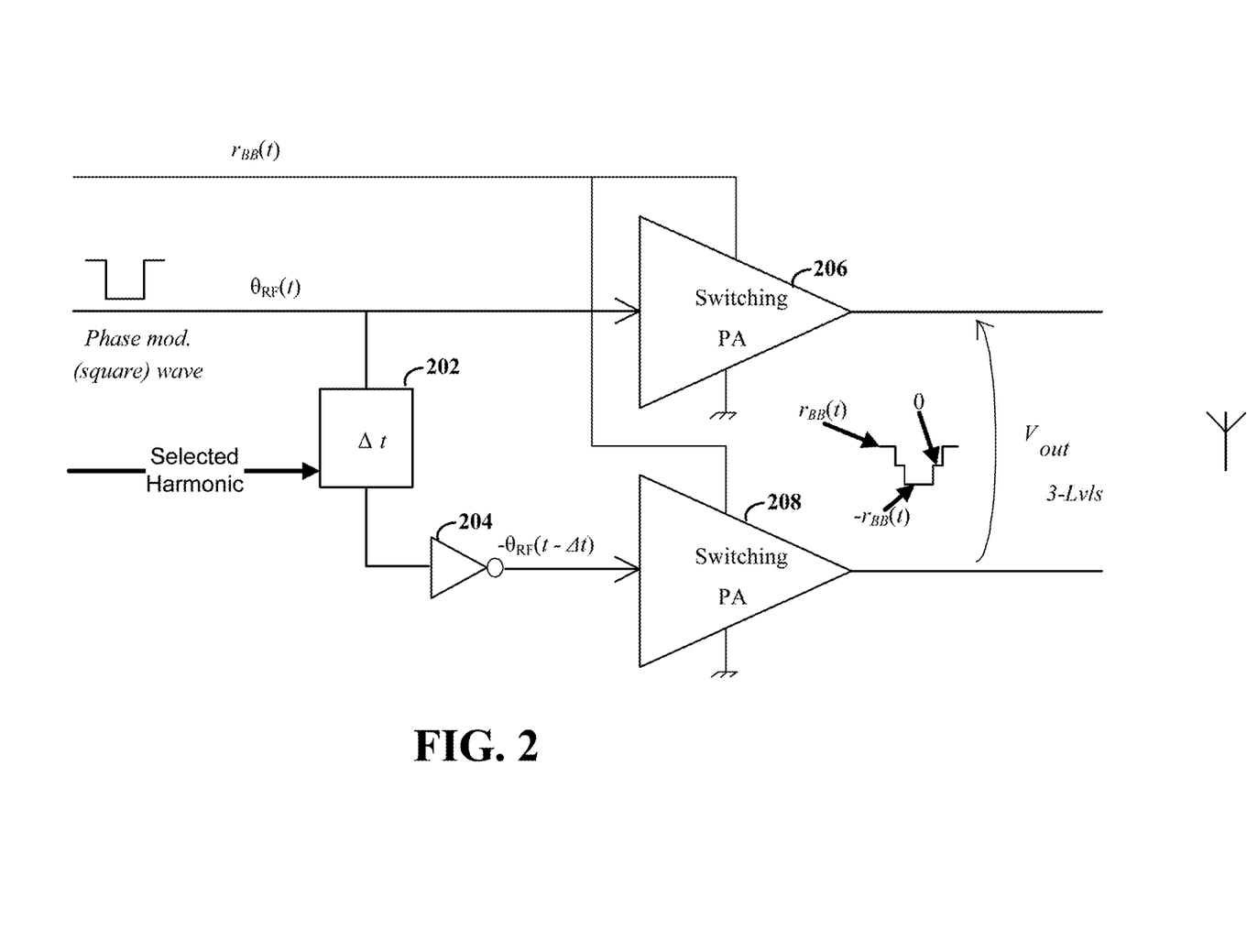
FIG. 2 depicts a block diagram for a device providing harmonic suppression with a differential signal as an output, consistent with embodiments of the present disclosure.

FIG. 2 depicts a block diagram for a device providing harmonic suppression with a differential signal as an output, consistent with embodiments of the present disclosure. A polar modulated signal contains a phase component ($\theta_{RF}(t)$) and an amplitude component ($r_{bb}(t)$). The polar modulated signal is amplified to produce a differential signal using class D switching (power) amplifiers 206 and 208. The use of switching amplifiers results in the amplified differential signal including a number of harmonics in addition to the fundamental frequency (the carrier wave frequency). In particular, the amplified differential signal can include odd harmonics because the differential signal is a square wave that is operating at or near the fundamental frequency.

Delay circuit 202 modifies the polar modulated signal ($\theta_{RF}(t)$) to delay the signal according to a time duration ($\Delta t$). Inverter 204 inverts the polar modulated signal ($\theta_{RF}(t)$). Inverter 204 is shown as being after delay circuit 202; however, inverter 204 can also be placed before delay circuit 202. Moreover, inverter 204 may not be necessary, such as where the switching amplifier 208 is configured as an inverting amplifier. Without the delay ($\Delta t$), the outputs of the switching amplifiers 206 and 208 would transition at (virtually) the same time to create alternating positive and negative differential voltages. The introduction of the delay ($\Delta t$) results in the transition for the switching amplifier 208 happening after that of the switching amplifier 206. During this delay period, the switching amplifiers 206 and 208 are at the same high or low output mode. Thus, the differential output is at or near zero (e.g., manufacturing variations can create minor differences in their respective outputs). After the delay ($\Delta t$), the switching amplifier 208 transitions and the (positive or negative) differential voltage is provided as an output.

Consistent with embodiments, the time duration for the delay ($\Delta t$) is set according to the frequency of the selected harmonic. For instance, the selected harmonic can be a particular odd harmonic having a frequency $f_h$. The delay ($\Delta t$) can be set to be half of a period of a frequency $f_h$. Various embodiments are directed toward a delay circuit 202 that is tunable to different harmonics. For instance, the delay circuit 202 can receive a variable data signal that identifies either the harmonic or the delay ($\Delta t$).

The amplitude component $r_{bb}(t)$ of the polar modulated signal can be used to adjust the signal (voltage) level for the positive and negative differential voltages that are provided as an output. In one embodiment, the adjustment can be carried out by modifying the gain of the switching amplifiers 206 and 208. In other embodiments, the adjustment can be carried out by adjusting the supply voltage level provided to the switching amplifiers 206 and 208. Thus, the differential output signal is depicted as having voltage levels $r_{bb}(t)$ and $-r_{bb}(t)$; however, the amplitude component signals that are provided as inputs to the switching amplifiers 206 and 208 do not necessarily have the same voltage as the output voltages, which could instead be an amplified version of the input voltage levels.

The input polar modulated signal is depicted as a square wave; however, in other embodiments the input polar modulated signal can have other forms. For instance, the input polar modulated signal could be a sine wave or a sawtooth wave.

Figure 3:
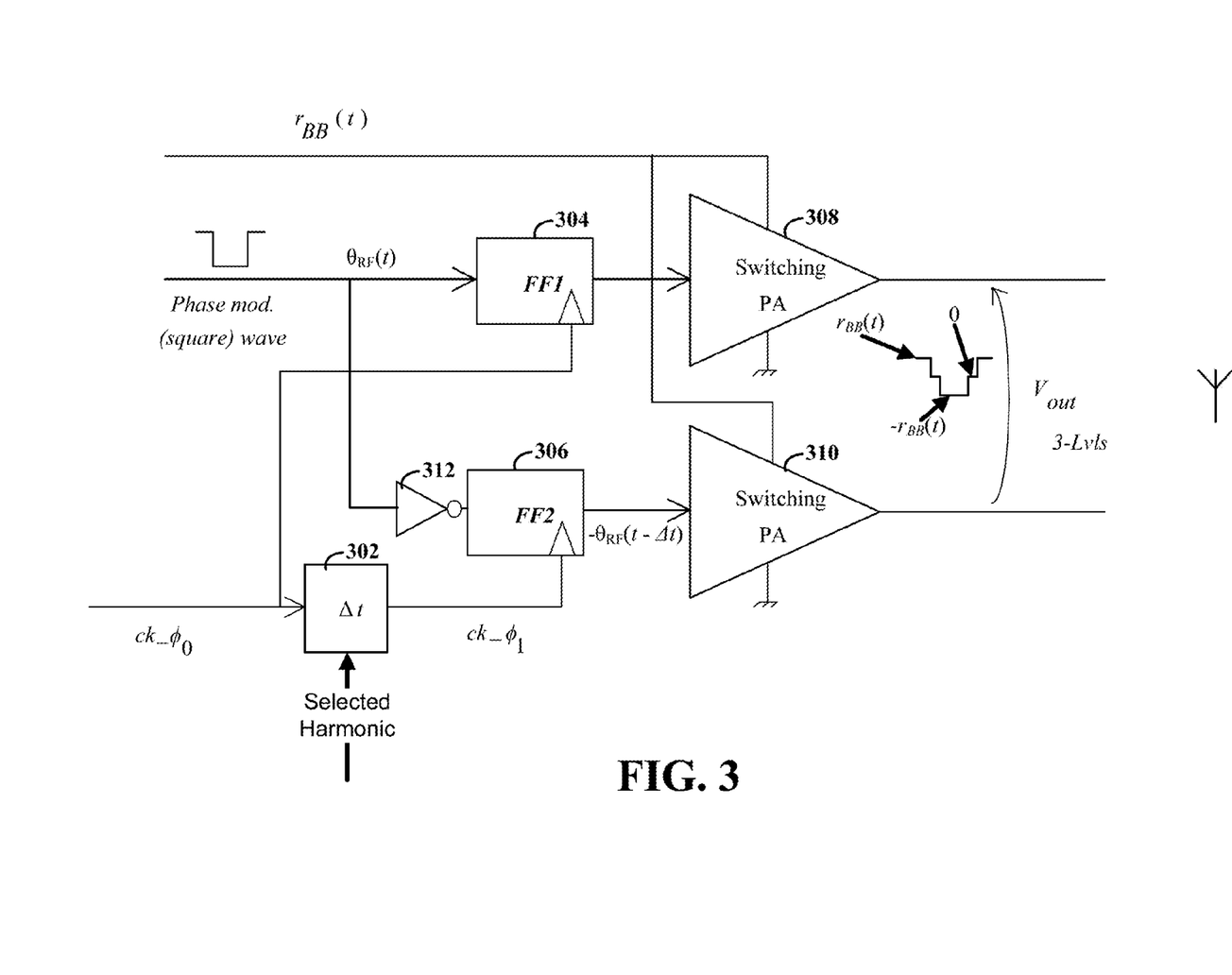
FIG. 3 depicts a block diagram for a device providing harmonic suppression with a differential signal as an output and a clocked-synchronized input signal, consistent with embodiments of the present disclosure.

FIG. 3 depicts a block diagram for a device providing harmonic suppression with a differential signal as an output and a clocked-synchronized input signal, consistent with embodiments of the present disclosure. Switching (power) amplifiers 308 and 310 are configured to generate a differential output signal with three signal levels, high, low and intermediate. The voltages of the high and low signal levels can be modified according to the input amplitude component ($r_{bb}(t)$) and thereby correspond to positive and negative voltage levels. The intermediate voltage level can correspond to (near) zero voltage.

Data latching circuits 304 and 306 provide a clocked version of the polar modulated signal ($\theta_{RF}(t)$). For instance, the data latching circuits 304 and 306 could be flip flops that output data provided at their respective inputs at the time of a clock edge. This data is maintained at the output until another clock edge is received. Inverter 312 creates an inverted version of the polar modulated signal ($\theta_{RF}(t)$) and can be located at different locations including before or after the latching circuit 306. In certain embodiments, inverter 312 is not used (e.g., where switching amplifier 310 is an inverting amplifier).

Delay circuit 302 introduces a delay ($\Delta t$) to a first clock signal (ck_$\phi_0$) according to a time duration ($\Delta t$) to produce a second the clock signal (ck_$\phi_1$). Latching circuit 304 is clocked using the first clock signal (ck_$\phi_0$) and latching circuit 306 is clocked using the second clock signal (ck_$\phi_1$). This causes a corresponding delay between data provided to each of the switching (power) amplifiers 308 and 310. The delay can also be referred to as a phase difference between the clocks, which can have the same frequency. As discussed herein, the time duration for the delay ($\Delta t$) can be set in response to the frequency of a selected harmonic.

Figure 4:
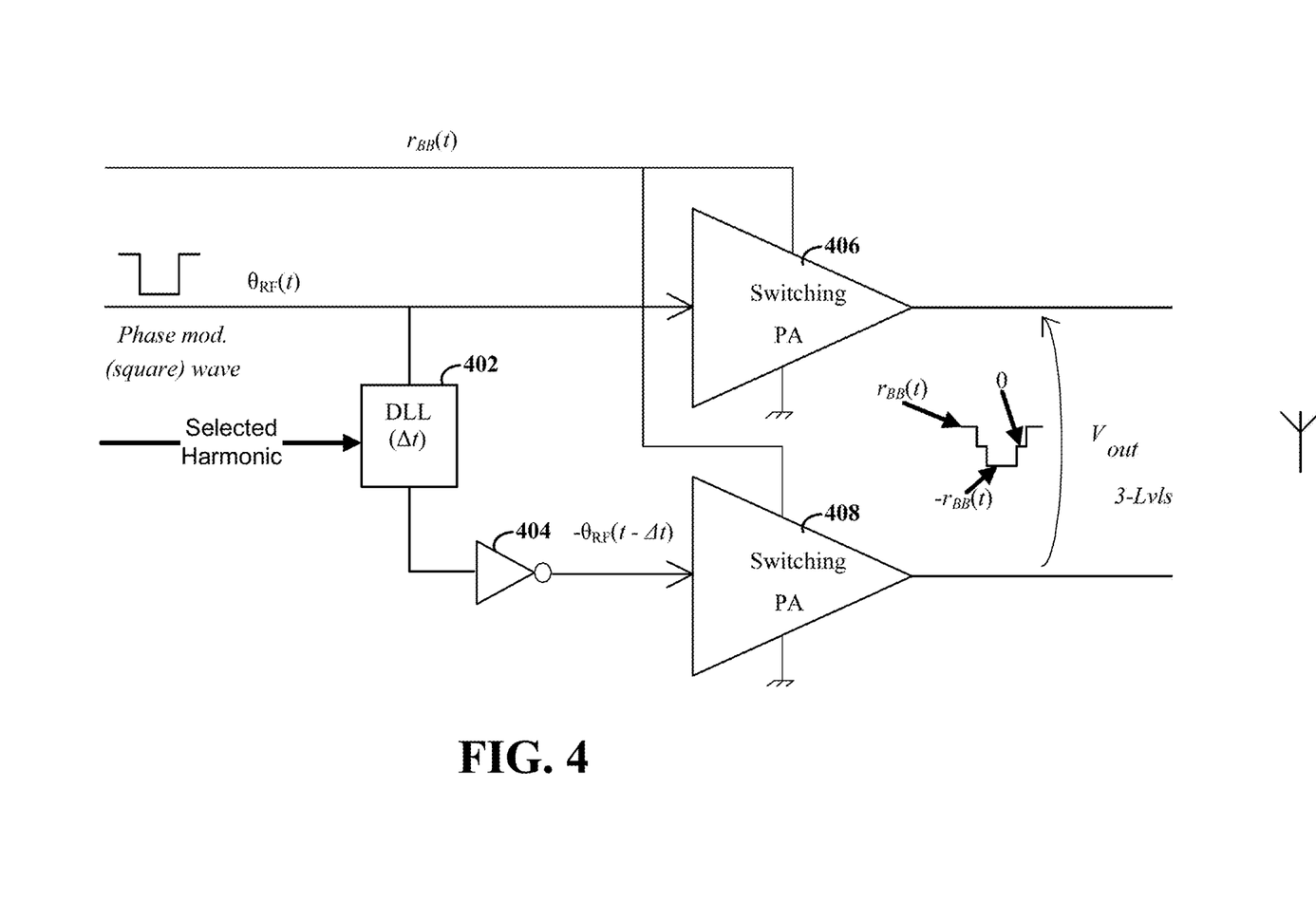
FIG. 4 depicts a block diagram for a device providing harmonic suppression with a differential signal as an output and a delay-locked loop (DLL) input signal, consistent with embodiments of the present disclosure.

FIG. 4 depicts a block diagram for a device providing harmonic suppression with a differential signal as an output and a delay-locked loop (DLL) input signal, consistent with embodiments of the present disclosure. Switching amplifiers 406 and 408 generate amplified versions of the polar modulated signal, with one of the generated signals being an inverted version per inverter 404. Inverter 404 can be located at different locations including before or after the delay circuit 402. In certain embodiments, inverter 404 is not used (e.g., where switching amplifier 408 is an inverting amplifier). Delay circuit 402 is configured to function as a delay-locked loop that introduces a corresponding delay ($\Delta t$) to the polar modulated signal. As discussed herein, the delay ($\Delta t$) can be determined and set in response to the frequency of a selected harmonic.

Figure 5:
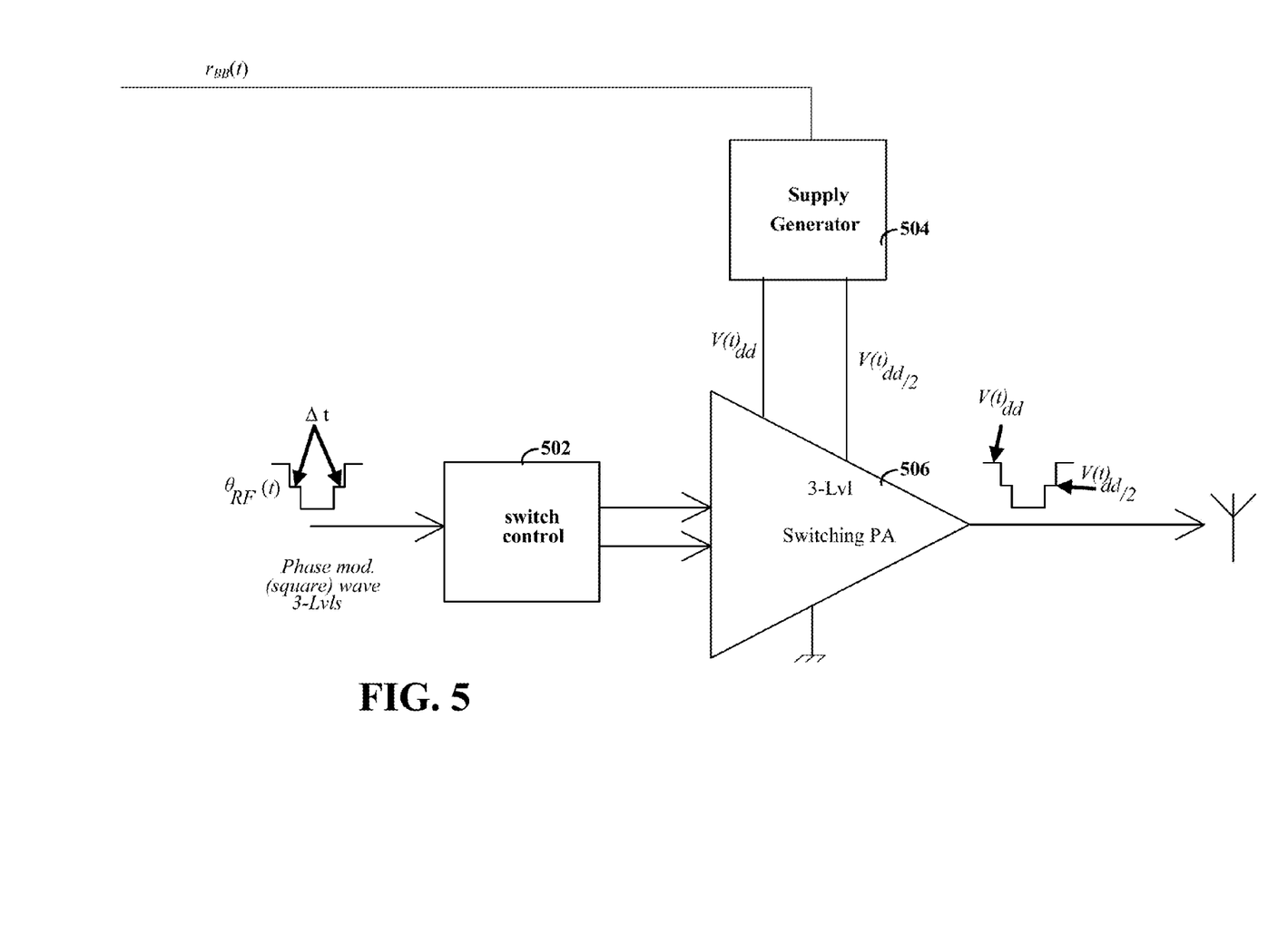
FIG. 5 depicts a block diagram for a device providing harmonic suppression with a single-ended output, consistent with embodiments of the present disclosure.

FIG. 5 depicts a block diagram for a device providing harmonic suppression with a single-ended output, consistent with embodiments of the present disclosure. Switching amplifier 506 is configured to generate a single-ended output (referenced to a common voltage level/ground). Switching amplifier 506 is also configured to generate three different voltage levels, which correspond to a reference (ground) voltage, a high voltage (supply voltage) and an intermediate voltage (one-half of the supply voltage). Supply voltage generator 504 is configured and arranged to provide a supply voltage ($V(t)_{dd}$) and an intermediate voltage ($V(t)_{dd}/2$) to switching amplifier 506.

Consistent with certain embodiments, the amplitude component ($r_{bb}(t)$) of the polar modulated signal can be provided to the supply generator 504. Supply generator 504 can thereby modify the generated voltages $V(t)_{dd}$ and $V(t)_{dd}/2$ according to the received amplitude component ($r_{bb}(t)$). In this manner, the generated voltages $V(t)_{dd}$ and $V(t)_{dd}/2$ vary in time (t) according to the amplitude component ($r_{bb}(t)$).

Consistent with various embodiments, switch control 502 can be configured and arranged to receive a polar modulated signal that contains the phase component ($\theta_{RF}(t)$). In a first implementation, the received polar modulated signal can already be modified to include a signal delay according to a time duration ($\Delta t$). This signal delay occurs during transitions between signal levels by introducing a third, intermediate signal level during the transitions. The period of time for the intermediate signal level corresponds to the time duration ($\Delta t$). The time duration ($\Delta t$) can be set in response to a frequency of a selected harmonic (e.g., equal to half of the period of the frequency).

Consistent with another embodiment, the switch control 502 can receive a signal indicating the selected harmonic and thereafter introduce the signal delay to the control signals provided to the switching amplifier 506.

Embodiments are directed toward combinations and implementations using different aspects from the various embodiments and figures herein. One such combination includes the use of two multiple level switching amplifiers, such as the switching amplifier 506, in a differential signaling application, such as a configuration of FIGS. 2-4. In particular implementations, the delay time for each of switching amplifiers could be set according to a different $\Delta t$ and corresponding harmonic. The resulting circuits are therefore capable of producing a differential signal having five signal levels and two different $\Delta t$ values, each $\Delta t$ value independently selected to suppress a different harmonic.

Figure 6:
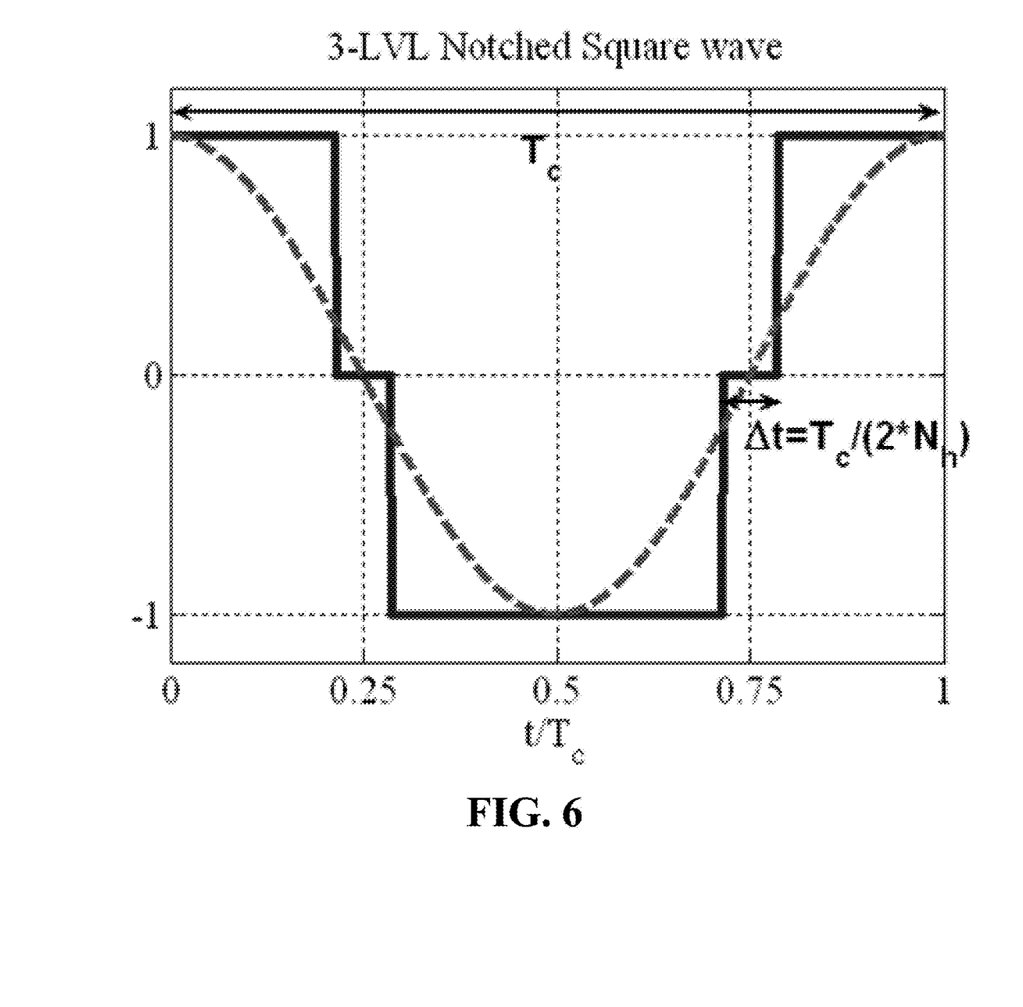
FIG. 6 depicts a three level, notched square wave, consistent with embodiments of the present disclosure.

FIG. 6 depicts a three level, notched square wave, consistent with embodiments of the present disclosure. The solid line shows a modified square wave that includes notches at zero volts. The notches have a time duration ($\Delta t$) that is determined in response to a frequency for a selected harmonic ($N_h$). In particular, the notches occur during both positive and negative transitions between high ("1") and low ("−1") signal levels and that correspond to an intermediate (0) signal level. The time duration is set according to the selected harmonic ($N_h$) and its frequency or period, which can be determined from the period ($T_a$) of the carrier wave, which is shown by the dotted line and its corresponding sine wave. For instance, the time duration ($\Delta t$) can be determined using the formula $\Delta t = T_c/(2 \cdot N_h)$. As there are relationships between frequency and period of carrier waves and their harmonics, the above formula can be modified in a number of ways including, but not limited to, a formula that uses the frequency of the harmonic, rather than the period.

Figure 7:
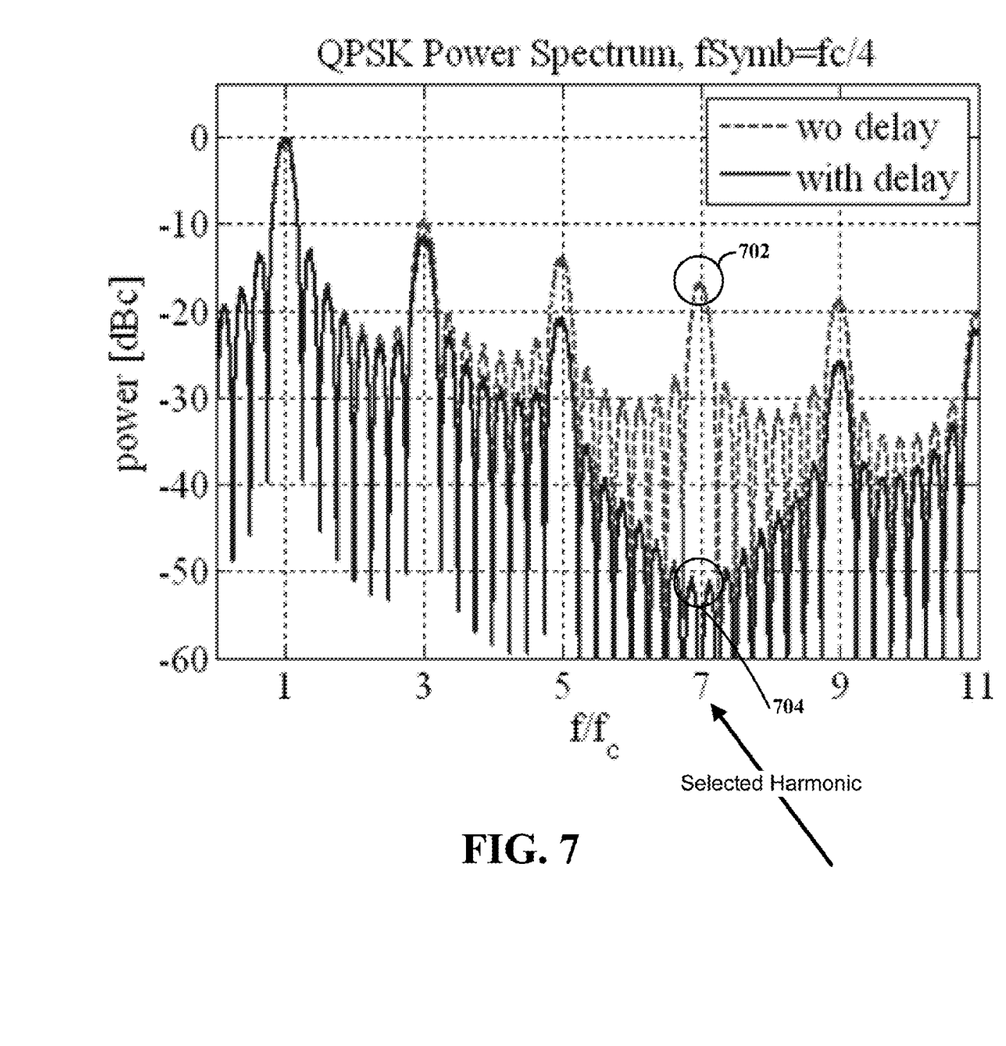
FIG. 7 depicts power spectrum for an experimental embodiment using Quadrature Phase Shift Keyed (QPSK) modulation, consistent with embodiments of the present disclosure.

FIG. 7 depicts power spectrum for an experimental embodiment using Quadrature Phase Shift Keyed (QPSK) modulation, consistent with embodiments of the present disclosure. The solid line represents power from an experimental transmitter that introduces a third signal level having a time duration (e.g., a signal transition delay) that corresponds to the selected harmonic. In this instance, the selected harmonic is the $7^{th}$ harmonic. The dotted line represents power from a transmitter that does not include the third signal level. Both transmitters are configured to use amplifiers that produce a square wave. The power of the $7^{th}$ harmonic was suppressed relative to power level 702 as shown by the suppressed level 704.

The particular experimental setup included a radio frequency identification (RFID) system operating at a carrier wave frequency of $f_c$=13.56 MHz and using QPSK modulation. The $7^{th}$ harmonic $f_0$=94.92 MHz falls in within the FM radio band. Accordingly, it may be desirable to suppress harmonics at or near the $7^{th}$ harmonic. This undesired interfering harmonic spectrum was suppressed by introducing a delay $\Delta t \approx 5.27$ ns.

Figure 8:
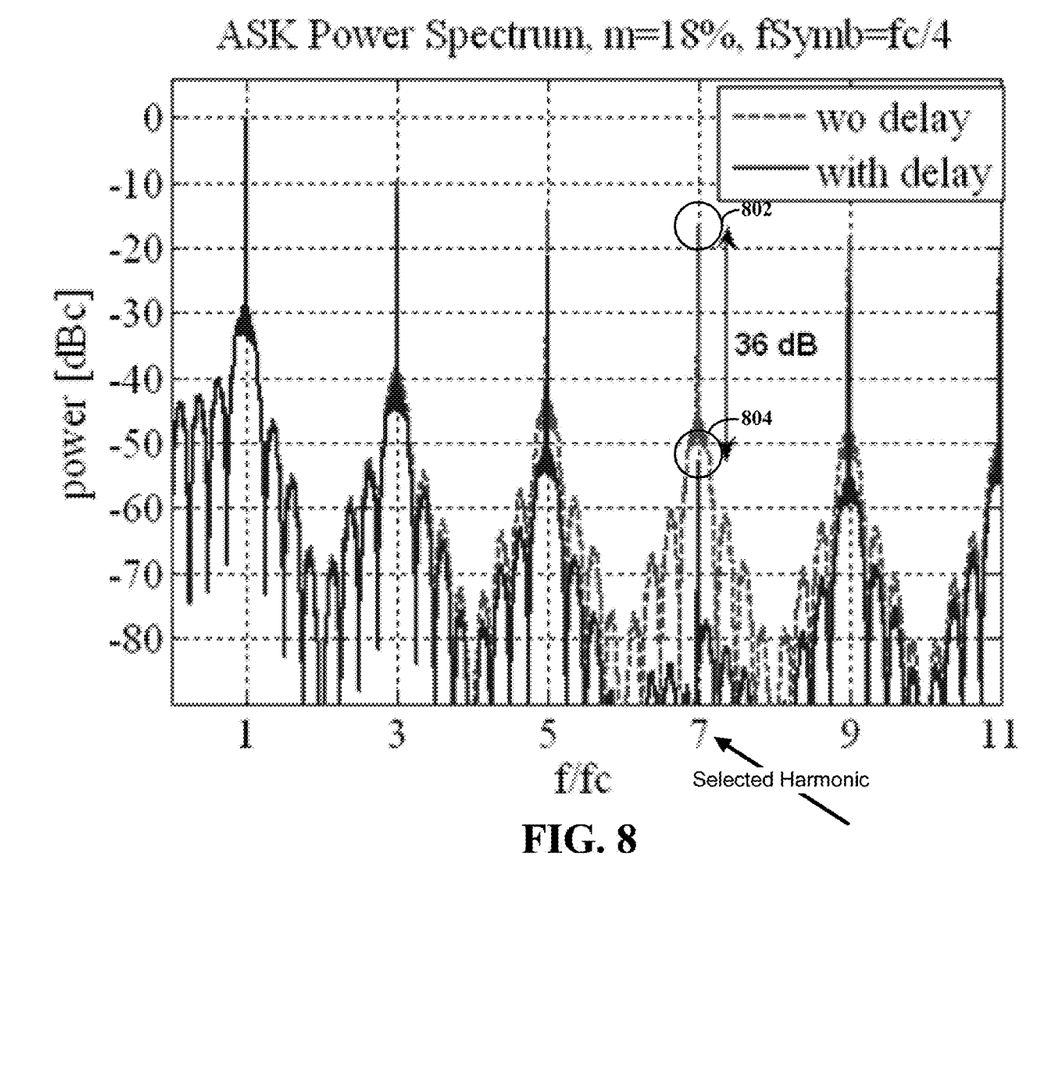
FIG. 8 depicts power spectrum for an experimental embodiment using amplitude shift keying (ASK) modulation, consistent with embodiments of the present disclosure.

FIG. 8 depicts power spectrum for an experimental embodiment using amplitude shift keying (ASK) modulation, consistent with embodiments of the present disclosure. The particular experimental setup included a radio frequency identification (RFID) system operating at $f_c$=13.56 MHz and using ASK modulation. The experimental circuit was again configured to suppress harmonics at or near the $7^{th}$ harmonic. This undesired interfering harmonic spectrum was suppressed by introducing a delay $\Delta t \approx 5.27$ ns.

In the experimental embodiments of FIGS. 7 and 8, an error was introduced to $\Delta t \approx 53$ ps. This error represents about 1% of the nominal $\Delta t$ value. The effect of delay inaccuracies was that the attenuation of the undesired harmonic was finite at about 36 dB. Without being limited by theory, an error of 6%, or about 300 ps, was found to lessen such attenuation to about 20 dB.

The signals and associated logic and functionality described in connection with the figures can be implemented in a number of different manners. Unless otherwise indicated, various general-purpose systems and/or logic circuitry may be used with programs in accordance with the teachings herein, or it may prove convenient to use a more specialized apparatus to perform the disclosed aspects. For example, according to the present disclosure, one or more of the methods can be implemented in hard-wired circuitry by programming a general-purpose processor, a digital signal processor (DSP) other fully or semi-programmable logic circuitry, and/or by a combination of such hardware and a general-purpose processor configured with software. Accordingly, the various components and processes shown in the figures can be implemented in a variety of circuit-based forms, such as through the use of data processing circuit modules.

It is recognized that aspects of the disclosure can be practiced with circuits and computer/processor-based system configurations other than those expressly described herein.

The corresponding structure for a variety of these systems and circuits would be apparent from the intended application and the above description.

The various terms and techniques are used by those knowledgeable in the art to describe aspects relating to one or more of communications, protocols, applications, implementations, and mechanisms. One such technique is the description of an implementation of a technique expressed in terms of an algorithm or mathematical expression. While such techniques may be implemented, for example, by executing code on a computer processor, the expression of that technique may be conveyed and communicated as a formula, algorithm, or mathematical expression.

For example, a block or module denoting "C=A+B" as an additive function implemented in hardware and/or software would take two inputs (A and B) and produce a summation output (C), such as in combinatorial logic circuitry. Thus, the use of formula, algorithm, or mathematical expression as descriptions is to be understood as having a physical embodiment in at least hardware (such as a processor circuit in which the techniques of the present disclosure may be practiced as well as implemented as an embodiment).

In certain embodiments, machine-executable instructions are stored for execution in a manner consistent with one or more of the methods of the present disclosure. The instructions can be used to cause a general-purpose or special-purpose processor that is programmed with the instructions to perform the steps of various methods. The steps may be performed by specific hardware components that contain hardwired logic for performing the steps, or by any combination of programmed computer components and custom hardware components.

In some embodiments, aspects of the present disclosure may be provided as a computer program product, which may include a machine or computer-readable medium having stored thereon instructions, which may be used to program a computer (or other electronic devices) to perform a process according to the present disclosure. Accordingly, the computer-readable medium includes any type of media/machine-readable medium suitable for storing electronic instructions.

Various modules may be implemented to carry out one or more of the operations and activities described herein and/or shown in the figures. In these contexts, a "module" is a circuit that carries out one or more of these or related operations/activities. For example, in certain of the above-discussed embodiments, one or more modules are discrete logic circuits or programmable logic circuits configured and arranged for implementing these operations/activities, as in the circuit modules shown in FIGS. 1-5. In certain embodiments, the programmable circuit is one (or more) computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

The various embodiments described above are provided by way of illustration only and should not be construed to limit the disclosure. Based on the above discussion and illustrations, those skilled in the art will readily recognize that various modifications and changes may be made to the present disclosure without strictly following the exemplary embodiments and applications illustrated and described herein. Such modifications and changes do not depart from the true spirit and scope of the present disclosure, which is set forth in the following claims.

What is claimed is:

1. A method for providing configurable suppression of harmonics in a radio frequency (RF) transmitter circuit that includes two class-D switching power amplifiers that produce a differential output signal having introduced harmonics, the method comprising:
    determining a time duration from a selected harmonic of the introduced harmonics;
    adjusting, based upon the determined time duration, a delay of a delay circuit;
    modifying, using a harmonic suppression circuit of the radio frequency transmitter circuit, a RF polar modulated data signal that is encoded using an amplitude component and a phase component that is defined relative to a carrier wave, the modification including adding the delay of the delay circuit to the RF polar modulated data signal; and
    amplifying the modified RF polar modulated data signal using a first of the switching power amplifiers and amplifying the unmodified RF polar modulated data signal using a second of the switching power amplifiers to produce an amplified signal of the RF polar modulated data signal, the amplified signal being a differential output signal that includes three signal levels, a high signal level, a middle signal level and a low signal level, wherein timing of transitions between the high and low signal levels represents the phase component and wherein the transitions include the middle signal level for the determined time duration, thereby suppressing the selected harmonic.

2. The method of claim 1, wherein step of modifying the RF polar modulated data signal includes introducing the middle signal level during a transition from the high to low signal levels and from the low to high signal levels.

3. The method of claim 1, wherein the step of determining the time duration is carried out as a function of a frequency of the selected harmonic.

4. The method of claim 1, wherein the step of determining the time duration is carried out by calculating a half a period of a frequency of the selected harmonic.

5. The method of claim 1, further including a step of implementing the time duration by delaying one of two clock signals driving flip flops to respective inputs to the two class-D switching amplifiers.

6. The method of claim 1, further including a step of implementing the time duration using a delay-locked loop (DLL) positioned before an input of one of the two class-D switching amplifiers.

7. The method of claim 1, further including a step of adjusting an amplitude of the amplified signal by modifying a supply voltage provided to each of the two class-D switching amplifiers in response to the amplitude component.

8. A device comprising:
    a transmitter circuit that includes
    two class-D switching amplifiers configured and arranged to produce a differential output signal having introduced harmonics in response to a radio frequency polar modulated data signal that is encoded using an amplitude component and a phase component that is defined, relative to a carrier, by timings of transitions between a high signal level and a low signal level; and a harmonic suppression circuit that:
   includes a delay circuit that is configured to introduce a delay that is tunable in response to a time duration corresponding to a selected harmonic; and that
   is configured and arranged to
      modify the polar modulated data signal using the delay circuit to introduce the delay to the polar modulated data signal;
      provide the modified polar modulated data signal to a first of the class-D switching power amplifiers;
      provide the unmodified polar modulated data signal to a second of the class-D switching power amplifiers; and
      produce, from outputs of the class-D switching power amplifiers, an amplified signal of the polar modulated data signal that includes a middle signal level that is between the high and low signal levels and for the time duration, thereby suppressing the selected harmonic.

9. The device of claim 8, wherein the harmonic suppression circuit is further configured and arranged to set the time duration to half of a period of a frequency of the selected harmonic.

10. The device of claim 8, wherein the delay circuit includes a DLL that is configured and arranged to delay the polar modulated data signal for the time duration before reaching one of the two class-D switching amplifiers.

11. The device of claim 8, wherein the delay circuit includes two flip-flops clocked by two different clock signals, the clock signals having a phase difference corresponding to the time duration.

12. A transmitter device comprising:
   a harmonic suppression circuit configured and arranged to introduce, to a polar modulated data signal that includes an amplitude component and a phase component that is defined by transitions between high and low signal levels, a third signal level having a voltage that is between voltages of the high and low signal levels and that has a time duration that is adjustable to different duration values based upon a frequency corresponding to different selected harmonics of harmonics introduced by class-D amplification;
   a supply generator circuit configured to provide a first voltage supply output corresponding to the high signal level and a second voltage supply output corresponding to the third signal level and to adjust the high signal level and the third signal level based upon the amplitude component, and
   a three-level class-D switching amplifier configured and arranged to
      receive power from the first voltage supply output and second voltage supply output; and
      amplify the polar modulated data signal to produce a single-ended output signal that includes the low, high, and third signal levels, wherein the third signal level corresponds to the time duration from the harmonic suppression circuit, thereby suppressing a particular selected harmonic.

13. The device of claim 12, wherein the harmonic suppression circuit is further configured and arranged to introduce the third signal level during the transitions, and wherein transitions include transitions from the high to low signal levels and from the low to high signal levels.

14. The device of claim 12, wherein the harmonic suppression circuit is further configured and arranged to introduce the third signal level during the transitions for the time duration by calculating the time duration as a function of a frequency of the particular selected harmonic.

15. The device of claim 12, further including a supply voltage circuit configured and arranged to provide supply voltage to the three-level switching amplifier and to vary a voltage level of the supply voltage in response to the amplitude component.

16. The device of claim 15, wherein the three-level switching amplifier is configured and arranged to generate the low signal level at zero voltage, the high signal level at the supply voltage as modified in response to the amplitude component and the third signal level at one-half of the supply voltage as modified in response to the amplitude component.

17. The device of claim 12, wherein the time duration corresponds to half of a period for a frequency of the particular selected harmonic.

18. The device of claim 12, wherein the harmonic suppression circuit configured and arranged to provide attenuation of at least 20 dB for a seventh harmonic of the polar modulated data signal, wherein the polar modulated data signal has a carrier wave frequency of 13.56 MHz.

* * * * *